(12) United States Patent
Ilzer et al.

(10) Patent No.: US 8,525,331 B2
(45) Date of Patent: Sep. 3, 2013

(54) CHIP DESIGN HAVING INTEGRATED FUSE AND METHOD FOR THE PRODUCTION THEREOF

(75) Inventors: Karl Ilzer, Graz (AT); Rainer Minixhofer, Unterpremstaetten (AT); Mario Manninger, Unterpremstaetten (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 13/141,687

(22) PCT Filed: Nov. 23, 2009

(86) PCT No.: PCT/EP2009/065652
§ 371 (c)(1),
(2), (4) Date: Oct. 11, 2011

(87) PCT Pub. No.: WO2010/072492
PCT Pub. Date: Jul. 1, 2010

(65) Prior Publication Data
US 2012/0104605 A1  May 3, 2012

(30) Foreign Application Priority Data

Dec. 22, 2008 (DE) .......................... 10 2008 064 428

(51) Int. Cl.
*H01L 23/48* (2006.01)
(52) U.S. Cl.
USPC ........... 257/737; 257/693; 257/738; 257/778; 257/E23.01; 257/E23.011; 257/E23.021; 257/E23.069; 438/106; 438/108; 438/613

(58) Field of Classification Search
USPC .......... 257/693, 737, 738, E23.021, E23.069, 257/208, 209, 690, 773, 778, E23.01, E23.014, 257/E23.024, E23.067, E23.068; 438/132, 438/108, 612–617; 361/626, 628, 630
See application file for complete search history.

(56) References Cited

U.S. PATENT DOCUMENTS

| | | | |
|---|---|---|---|
| 5,021,861 A | 6/1991 | Baliga | |
| 6,033,939 A * | 3/2000 | Agarwala et al. | 438/132 |
| 6,365,433 B1 | 4/2002 | Hyoudo et al. | |
| 7,005,727 B2 | 2/2006 | Azimi et al. | |
| 2001/0048148 A1 | 12/2001 | Koyama et al. | |
| 2002/0047634 A1 | 4/2002 | Ito et al. | |
| 2006/0267722 A1 | 11/2006 | Graf et al. | |
| 2008/0182361 A1 | 7/2008 | Horton et al. | |
| 2008/0265389 A1 | 10/2008 | Hsu et al. | |
| 2009/0026613 A1* | 1/2009 | Suh | 257/738 |
| 2009/0051030 A1* | 2/2009 | Yang et al. | 257/738 |
| 2011/0287584 A1* | 11/2011 | Suh et al. | 438/113 |

FOREIGN PATENT DOCUMENTS

| | | |
|---|---|---|
| DE | 101 33 007 | 1/2002 |
| DE | 103 34 433 | 3/2005 |
| DE | 10 2005 024347 | 11/2006 |
| GB | 1 451 960 | 10/1976 |
| JP | 01-295440 | 11/1989 |

(Continued)

*Primary Examiner* — Jasmine Clark
(74) *Attorney, Agent, or Firm* — McDermott Will & Emery LLP

(57) ABSTRACT

A chip design (1) comprising an external supply connection (VBAT), an internal supply connection (VDD), an integrated circuit (2) that is coupled to the internal supply connection (VDD) for voltage supply, and a fuse (3) that electrically connects the internal supply connection (VBAT) and is arranged within the chip design (1).

16 Claims, 3 Drawing Sheets

(56) References Cited

FOREIGN PATENT DOCUMENTS

| | | |
|---|---|---|
| JP | 6-139915 | 5/1994 |
| JP | 62-14935 | 8/1994 |
| JP | 2000-115993 | 4/2000 |
| JP | 2008-28414 | 2/2008 |
| JP | 2009-187418 | 8/2009 |
| WO | WO 2005/031866 | 4/2005 |

* cited by examiner

CHIP DESIGN HAVING INTEGRATED FUSE AND METHOD FOR THE PRODUCTION THEREOF

RELATED APPLICATIONS

This application is a U.S. National Phase Application under 35 USC 371 of International Application No. PCT/EP2009/065652, filed on 23 Nov. 2009.

This patent application claims the priority of the German patent application DE 10 2008 064 428.5 filed Dec. 22, 2008, the disclosure content of which is hereby incorporated by reference.

FIELD OF THE INVENTION

The invention relates to a chip package and also to a method for the production of a chip package.

BACKGROUND OF THE INVENTION

In many modern devices, electronic circuits are used as integrated components. Such components with integrated circuits that are also called chips have different constructions with respect to their housing and their connections.

An error function of the component can lead to damage or destruction of the corresponding device. To this end, many supply connections of the component are connected by means of a fuse to a power supply of the device. Such a fuse, however, requires space on a circuit board carrying the component.

If a component is provided for carrying out, for example, a voltage increase of a supply voltage applied on its input side, a continued operation of this component may have to be limited in an error state of this component. For example, a continued operation of this component may not be recommended or may even be prohibited under some circumstances, dependent on corresponding technical regulations. For example, in the case of such a component, a fire caused by an error state should be prevented. A corresponding significance relates to the reliability of the fuse.

SUMMARY OF THE INVENTION

One object of the invention is to provide an arrangement with a chip package in which the chip package is protected against error functions in a less complex and more reliable way. Another object of the invention is to provide a method for the production of a chip package that is protected against error functions more reliably.

In one embodiment, a chip package comprises an external supply connection, an internal supply connection, and an integrated circuit that is coupled with the internal supply connection for the power supply. A fuse is further provided that connects the internal supply connection electrically to the external supply connection and is arranged within the chip package.

The chip package can comprise different structural forms. The chip package consequently relates, in particular, to the unit made from the integrated circuit and connection points that can be used, for example, on a circuit board. Thus, in the described embodiment of the chip package, the fuse is an integral part of the component, so that an additional fuse does not need to be provided for use on a circuit board.

The fuse is advantageously arranged outside of the integrated circuit. In particular, advantageously there is no electrical connection between the integrated circuit and the external supply connection on which a supply voltage can be applied during operation of the chip module. Thus it is guaranteed that, in the case of an error in which the fuse is destroyed, voltage is reliably prevented from being provided to the integrated circuit.

An integrated circuit is typically characterized in that it has several active and/or passive components that are realized, among other things, by corresponding semiconductor structures. These elements are constructed here together in a semiconductor material. Accordingly, these elements can also be sensitive relative to overvoltages or error cases in general.

In one embodiment, the integrated circuit of the chip package is integrated on a semiconductor body that has a first connection point and a second connection point. The first connection point is designed for the power supply of the integrated circuit and is coupled with the internal supply connection, while the second connection point is coupled with the external supply connection. With the exception of the fuse, an electrical connection of the integrated circuit to the external supply connection is not provided. In other words, when the fuse is destroyed, no voltage can be fed to the integrated circuit via the external supply connection.

A semiconductor body thus comprises the integrated circuit. However, the semiconductor body could also comprise regions that are not part of the integrated circuit and/or have no electrical connection to the integrated circuit.

In one embodiment of the chip package, this is constructed as a wafer-lever chip-scale package, WL-CSP. In such an embodiment, the integrated circuit is produced, for example, on a semiconductor body and then provided with an additional layer that comprises the connections of the integrated circuit. Here, both the production of the integrated circuit and also the application of the additional layer on a wafer that is only then sectioned into the individual components are realized. A size of the chip package is produced essentially directly from or during the sectioning of the wafer. For example, the surface area of the integrated circuit on the wafer also corresponds to the surface area of the final chip package.

Advantageously, the connections in the additional layer are constructed as solder balls. In particular, the internal and external supply connections are constructed as solder balls.

For example, in the chip package, a redistribution layer that comprises the external supply connection, the internal supply connection, and the fuse is applied on the integrated circuit.

Advantageously, here the fuse is constructed in the redistribution layer as an elongated metallic layer that electrically connects the external supply connection and the internal supply connection. The additional layer or redistribution layer can consequently comprise several individual layers that can each be conductive or non-conductive, or insulating. Because the redistribution layer with the fuse does not include the integrated circuit, it can be guaranteed, in turn, that for a destroyed fuse, a supply voltage cannot be led to the integrated circuit via the external supply connection.

In one special embodiment, the width of the elongated metallic fuse layer is reduced at least at one location. In this way it can be advantageously achieved that a current load is increased at this location in comparison with the rest of the elongated fuse, so that in the event of an overcurrent, a melt-through—that is, a destruction of the fuse—takes place advantageously at this location. Furthermore, through the described notching of the elongated fuse, the reliability of the fuse in the event of an overcurrent is improved.

As a material, the fuse comprises a very conductive metallic material, for example, at least one of the following: titanium/aluminum, aluminum, copper.

In alternative embodiments of the chip package, this is constructed as a ball-grid array, BGA, or as a pin-grid array, PGA.

In one alternative embodiment of the chip package, this comprises a housing that has at least the external supply connection and the internal supply connection. The integrated circuit is arranged within the housing, wherein the coupling of the external supply connection with the second connection point on the semiconductor body is realized by means of a fuse that is formed in this embodiment by a bonding wire.

The bonding wire is here dimensioned such that it melts and is destroyed for a defined overcurrent. Because the second connection point without the fuse has no electrical connection to the external supply connection, when the fuse is destroyed or when the bonding wire is destroyed, there is a better guarantee of the protection of the integrated circuit.

In the different embodiments of the chip package, this could have a reference connection. Here, the chip package is designed such that, between the internal supply connection and the reference connection, a charge storage device is connected. This charge storage device can be used for buffering the supply voltage. The reference connection is advantageously connected electrically to a reference potential during operation.

In one embodiment of a method for the production of a chip package, an integrated circuit is produced, for example, on a semiconductor body or wafer. With the integrated circuit, the chip package is produced, wherein the chip package comprises an external supply connection and an internal supply connection. The integrated circuit is coupled for the power supply with the internal supply connection. Furthermore, within the chip package, a fuse is provided that connects the internal supply connection electrically to the external supply connection.

For example, the integrated circuit is produced on a semiconductor body that has a first connection point that is designed for the power supply of the integrated circuit and is coupled with the internal supply connection and has a second connection point that is coupled with the external supply connection via the fuse.

In one special embodiment, for the provision of the chip package and the provision of the fuse, a redistribution layer is applied on the integrated circuit, wherein the redistribution layer comprises the external supply connection, the internal supply connection, and the fuse.

In another special embodiment, for the production of the chip package, a housing is provided with the external supply connection and the internal supply connection, with this housing comprising the integrated circuit, wherein the fuse is constructed as a bonding wire.

In other embodiments, the chip package is produced according to one of the previously described embodiments of the chip package.

BRIEF DESCRIPTION OF THE DRAWINGS

The invention will be explained in detail below using embodiments with reference to the figures. Elements with identical functions or effects here carry identical reference symbols.

Shown are.

DETAILED DESCRIPTION OF THE DRAWINGS

Figure 1:
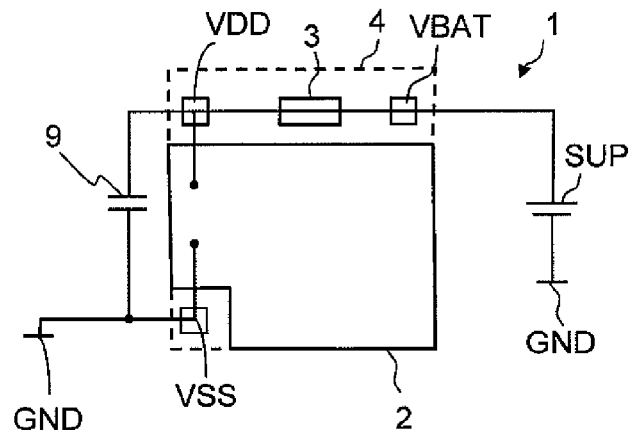
FIG. 1, a first embodiment of a chip package,
FIG. 2, a second embodiment of a chip package,
FIGS. 3A and 3B, embodiments of an integrated fuse,
FIG. 4, a current-time diagram for different embodiments of an integrated fuse,
FIG. 5, a third embodiment of a chip package, and
FIG. 6, an embodiment of a chip package with connected circuit.

FIG. 1 shows a general embodiment of a chip package 1. On a semiconductor body 4, an integrated circuit 2 is provided that is coupled with an internal supply connection VDD for the power supply. Furthermore, a reference connection VSS coupled with the integrated circuit 2 is provided that is connected to an external ground connection GND. Between the internal supply connection and the reference connection, a charge storage device 9 is arranged. On the semiconductor body 4, an external supply connection VBAT is further arranged that is connected electrically to the internal supply connection VDD via a fuse 3. The external supply connection VBAT is further connected to an external voltage source SUP that is constructed, for example, as a battery.

A power supply of the integrated circuit 2 is thus performed by the external voltage source SUP via the external supply connection VBAT and the fuse 3 that is constructed advantageously as a melting fuse. The charge storage device 9 on the internal supply connection VDD is used for the voltage stabilization of the supply voltage on the supply connection VDD. The charge storage device 9 could also be omitted in various embodiments and is not a part of the chip package 1.

The objective of using fuse 3 is not to protect the integrated circuit 2 from overvoltages. That is accomplished, if necessary, by other components. Instead, fuse 3 is intended to protect the integrated circuit 2 from the consequences of any error states. These could include, for example, short circuits that could lead to dangerous consequences, such as fire. Such error states could occur, in particular, behind the fuse 3, that is, on the connection VDD or within the integrated circuit 2. Overvoltages that are caused by electrostatic discharge, ESD, should not cause the fuse 3 to respond because, after an ESD voltage pulse, a continued functioning of the integrated circuit 2 should be guaranteed.

Through the charge storage device 9, for an ESD event, a part of the ESD pulse can be already absorbed. Therefore, it is more easily possible to protect the integrated circuit 2 from this ESD pulse.

The chip package 1 could be used directly on a circuit board, without an additional safety device of the supply voltage having to be realized on the circuit board. In one error situation that can be produced, for example, by an error function of the integrated circuit 2 or a circuit connected to the integrated circuit 2, the fuse 3 is destroyed, so that the integrated circuit 2 is reliably separated from the supply voltage. A resumption of the operation of the integrated circuit 2 or the chip package 1 is advantageously not possible, because the fuse 3 is irreversibly destroyed in the error state.

For example, the integrated circuit is provided for the power supply of a xenon lamp that requires a higher voltage than is typically provided by an existing voltage source on the circuit board. Through the integrated circuit, consequently, an input voltage on the internal or external supply connection VDD, VBAT is converted into a significantly higher output voltage on the order of magnitude of approximately 300 V. However, it is prescribed that such an output voltage be effectively protected in the error state. When the fuse is triggered by an error state as described above, it should be guaranteed that the chip package no longer operates and, in particular, a dangerous voltage can no longer be output. Thus, because current can no longer be absorbed by the chip package, it can also be guaranteed that there is no fire or similar damage to the component or the circuit board.

The chip package can have a different embodiment, such as, for example, a chip housing with external connections, with this housing holding the integrated circuit. The chip package could also be constructed as a ball-grid array, BGA, or as a pin-grid array, PGA.

In the different embodiments, the fuse and the external supply connection VBAT are advantageously arranged so that, after destruction of the fuse, for example by burning through or disconnection of the fuse 3, there is no electrical connection of the integrated circuit 2 to the external supply connection VBAT. Therefore, among other things, it can be guaranteed that resulting damages can be avoided, because the energy feed from the supply is broken by the fuse 3.

Figure 2:
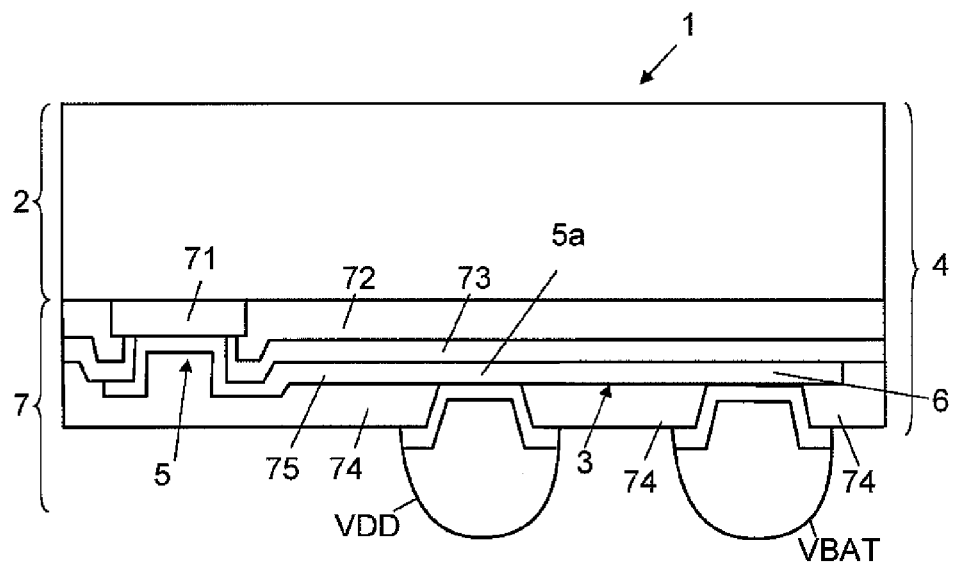

FIG. 2 shows an alternative embodiment of a chip package 1 that is constructed according to the principle of the wafer-level chip-scale package, WL-CSP. To this end, the chip package 1 has a semiconductor body 4 that has a layer with the integrated circuit 2 and a redistribution layer 7, RDL. The redistribution layer 7 comprises a layer 71 that forms a contact to the integrated circuit 2 for the purpose of voltage supply. The redistribution layer 7 further comprises layers 72, 73, 74, 75, the internal supply connection VDD, and the external supply connection VBAT.

The layers 72, 73, 74 are constructed as non-conductive or insulating layers. The internal and the external supply connections VDD, VBAT are each constructed as solder balls that are used, for the application on a circuit board, for the production of each electrical contact. In particular, the solder balls can be used for soldering with the circuit board.

The supply connections VBAT, VDD are connected electrically to the layer 71 via the layer 75 that is conductive and advantageously metallic, wherein the U-shaped cross section of the layer 75 underneath the layer 71 forms a first connection point 5. The region of the layer 75 between the external and the internal supply connection VBAT, VDD is used as the fuse 3. Furthermore, a second connection point 6 is formed by the region of the layer 75 above the external supply connection VBAT and a third connection point 5a is formed by the region of the layer 75 above the internal supply connection VDD.

The construction of the fuse 3 in the layer 75 will be discussed in more detail in the statements concerning FIGS. 3A, 3B and 4.

In the production of a chip package 1 according to the embodiment in FIG. 2, initially the integrated circuit 2 is produced on a semiconductor substrate, a wafer, wherein the wafer typically comprises several identical or different integrated circuits. After the integrated circuit 2 is produced on the wafer, the redistribution layer 7 is applied on the wafer or the semiconductor substrate. It is understood that the construction of the additional layer 7 in FIG. 2 is shown only as an example and can also have additional connections and/or layer sequences.

After the application of the additional layer 7, the wafer is sectioned into the individual chip structures that can then be used or soldered directly on a circuit board without providing a housing.

Figure 3A:
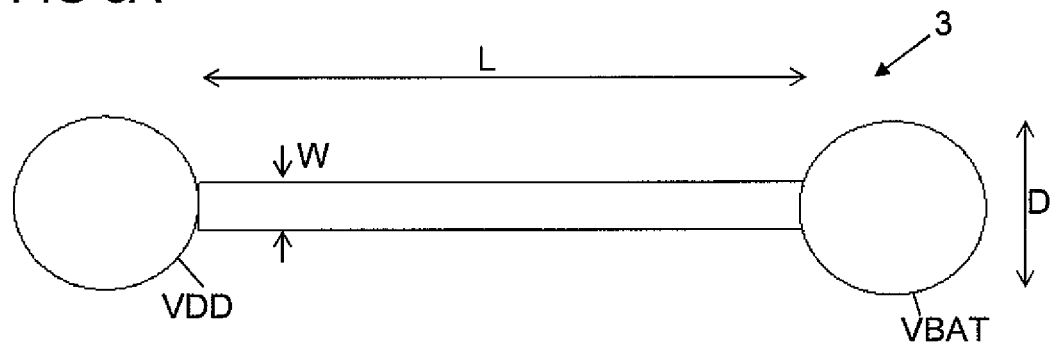
Figure 3B:
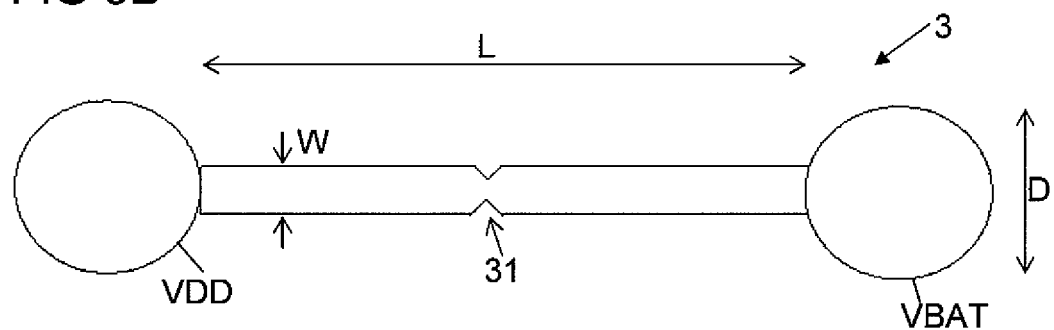

FIGS. 3A and 3B show embodiments of a fuse 3 that can be integrated, for example, in the redistribution layer 7. The fuse 3 is shown in FIGS. 3A and 3B between the supply connections VBAT, VDD that have a diameter D. For example, the diameter D equals approximately 300 µm. The fuse 3 has a length L and a width W, wherein the length L equals, for example, 200 µm. The fuse 3 is advantageously constructed in the redistribution layer as an elongated metallic layer, wherein, as the material, a very conductive metallic material, for example, titanium/aluminum, aluminum, or copper could be used.

In FIG. 3A, the fuse 3 has a uniform and constant width W. In the error state in which an overcurrent flows via the fuse 3, the fuse 3 melts due to thermal effects. The fuse 3 thus could also be designated as a melting fuse.

In FIG. 3B, the fuse 3 has, at one point 31, a notch, that is, its width is reduced. At this point, during operation, an increased current density appears that leads to an elevated temperature in comparison with that of the other regions of the fuse. In the error state, in this embodiment, the fuse 3 melts advantageously at the point 31 due to the thermal effects.

Figure 4:
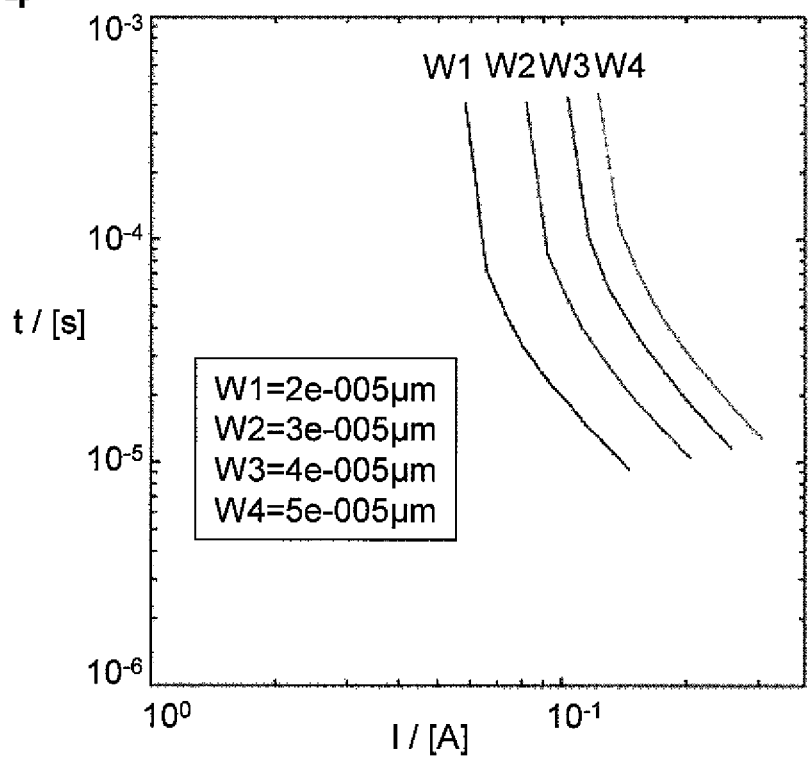

FIG. 4 shows an example current-time diagram with respect to the burning-through of a fuse for different widths W using widths W1, W2, W3, W4 as examples.

From the diagram it can be seen that a burn-through time of the individual fuses becomes shorter with increased current flux. It is further apparent that with increased width W, the current capacity of the fuse increases. The smaller the error current is, the longer the fuse can carry a load without burning through.

Figure 5:
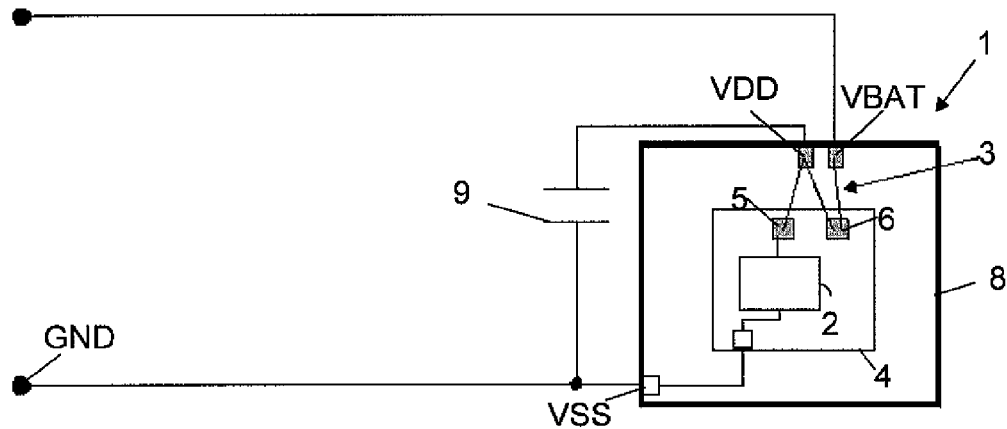

FIG. 5 shows an alternative embodiment of a chip package 1 in which the chip package 1 comprises a housing 8 that has the external and the internal supply connections VBAT, VDD and also the reference connection VSS and holds a semiconductor body 4 with the integrated circuit 2. On the semiconductor body 4 there are first and second connection points 5, 6, wherein only the first connection point 5 is directly connected electrically to the integrated circuit 2. The second connection point 6 is connected by means of bonding wires to the internal supply connection VDD and the first connection point 5. The second connection point 6 is further coupled with the external supply connection VBAT via a fuse 3 constructed as a bonding wire.

A corresponding current at which the fuse 3 constructed as a bonding wire reacts defines the type and thickness of the bonding wire being used. The fuse 3 constructed as a bonding wire could also be called a melting fuse.

Due to the fuse 3 arranged within the housing 8 or the chip package 1, the external supply connection VBAT can be connected directly to an external power source, without another fuse having to be provided. If the fuse 3 is destroyed in the error state, it is then guaranteed that resulting damages caused by an error state in the integrated circuit 2 or a connected circuit are avoided.

In an alternative embodiment, the second connection point 6 could also be left out, wherein, in this case, the first connection point 5 would be connected, on one side, via a bonding wire to the internal supply connection VDD and, on the other side, via the fuse 3 constructed as a bonding wire to the external supply connection VBAT. In this case, dangerous resulting damages would also be avoided.

Figure 6:
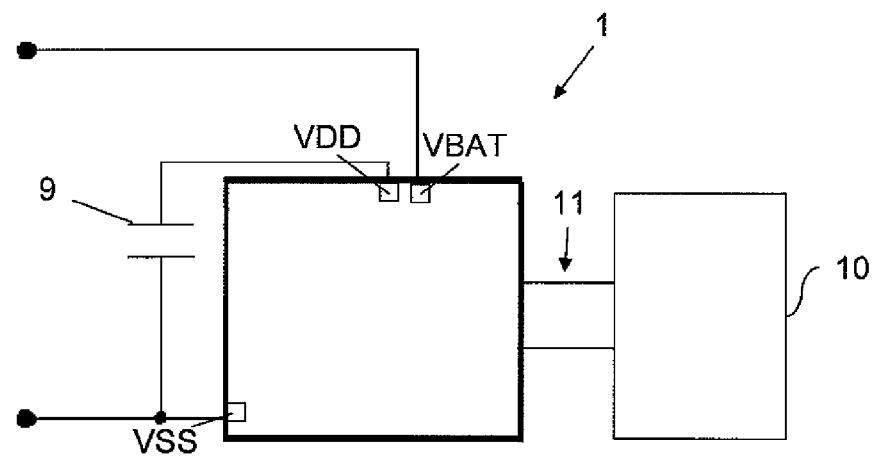

FIG. 6 shows an embodiment of a chip package 1 with a circuit 10 connected via an electrical connection 11. A fuse 3 (not shown here for reasons of clarity) is connected between the external supply connection VBAT and the internal supply connection VDD in any of the various implementation forms. The chip package could be formed according to one of the described embodiments. The circuit 10 represents, for example, a load that is supplied by the integrated circuit or the chip package 1. For example, the load is formed by a passive element such as a resistor, a coil, or a capacitive load. Alternatively, the load could also be constructed as a transformer, as one or more light-emitting diodes, or as a xenon flash lamp. In an error state in the circuit 10, it can also result in an overcurrent via the fuse wherein this fuse would then be triggered. Thus, also for an error in the circuit 10, resulting damages such as, e.g., fire, are also avoided.

It should be noted that the fuse 3 in the described embodiments represents a safety device of the chip package, that is, a safety measure. The fuse 3 is not used for programming a configuration of the integrated circuit 2.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A chip package comprising:
    an external supply connection;
    an internal supply connection;
    an integrated circuit that is coupled with the internal supply connection for the power supply; and
    a fuse that connects the internal supply connection electrically to the external supply connection and is arranged within the chip package,
    wherein the external supply connection and the internal supply connection are constructed as solder balls.

2. The chip package according to claim 1, wherein the fuse is arranged outside of the integrated circuit.

3. The chip package according to claim 1, wherein the integrated circuit is integrated on a semiconductor body that has a first connection point that is designed for the power supply of the integrated circuit and is coupled with the internal supply connection and has a second connection point that is coupled with the external supply connection, and
    wherein the fuse provides the only electrical connection of the integrated circuit with the external supply connection.

4. The chip package according to claim 1, which is constructed as a wafer-level chip-scale package or as a ball-grid array, BGA, or as a pin-grid array, PGA.

5. The chip package according to claim 1, wherein a redistribution layer that comprises the external supply connection, the internal supply connection, and the fuse is applied on the integrated circuit.

6. The chip package according to claim 5, wherein the fuse is constructed in the redistribution layer as an elongated, metallic layer that connects the external supply connection and the internal supply connection electrically.

7. The chip package according to claim 6, wherein the elongated, metallic layer of the fuse is reduced in its width at least at one point.

8. The chip package according to claim 6, wherein the fuse comprises, as the material, at least one of the following: a very conductive metallic material, titanium/aluminium, aluminium, copper.

9. The chip package according to claim 3, which has a housing with the external supply connection and the internal supply connection, wherein the coupling of the external supply connection to the second connection point is the fuse that is constructed as a bonding wire.

10. The chip package according to claim 1, which has a reference connection, wherein the chip package is designed such that a charge storage device is connected between the internal supply connection and the reference connection, the charge store being provided for voltage stabilization of the supply voltage at the internal supply terminal.

11. A method for the production of a chip package comprising:
    producing an integrated circuit;
    producing the chip package with the integrated circuit, wherein the chip package comprises an external supply connection and an internal supply connection, and the integrated circuit is coupled with the internal supply connection for the power supply; and
    providing a fuse that connects the internal supply connection electrically to the external supply connection within the chip package,
    wherein the external supply connection and the internal supply connection are constructed as solder balls.

12. The method according to claim 11, wherein the integrated circuit is produced on a semiconductor body that has a first connection point that is adapted for the power supply of the integrated circuit and is coupled with the internal supply connection and has a second connection point that is coupled with the external supply connection via the fuse.

13. The method according to claim 11, wherein, for the production of the chip package and the provision of the fuse, a redistribution layer is applied on the integrated circuit, wherein the redistribution layer comprises the external supply connection, the internal supply connection and the fuse.

14. The method according to claim 11, wherein, for the production of the chip package, a housing is provided with the external supply connection and the internal supply connection, with this housing comprising the integrated circuit, wherein the fuse is constructed as a bonding wire.

15. The method according to claim 11, further comprising:
    providing a reference connection; and
    connecting a charge storage device between the internal supply connection and the reference connection.

16. The method according to claim 11, wherein the charge storage device is provided for voltage stabilization of the supply voltage at the internal supply terminal.

* * * * *